US008741389B2

(12) United States Patent
Sapozhnikov et al.

(10) Patent No.: US 8,741,389 B2
(45) Date of Patent: Jun. 3, 2014

(54) CONTROLLING THICKNESS UNIFORMITY AND INTERFACES IN STACKS

(75) Inventors: Victor Boris Sapozhnikov, Minnetonka, MN (US); Taras Grigorievich Pokhil, Arden Hills, MN (US); Konstantin Nikolaev, Edina, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 959 days.

(21) Appl. No.: 12/486,354

(22) Filed: Jun. 17, 2009

(65) Prior Publication Data

US 2010/0323100 A1 Dec. 23, 2010

(51) Int. Cl.
*B05D 5/00* (2006.01)

(52) U.S. Cl.
USPC .......................................................... 427/402

(58) Field of Classification Search
USPC ................. 427/127–132, 248.1, 250, 255.28, 427/255.7, 402, 407.1–412.5, 419.1–419.8
See application file for complete search history.

(56) References Cited

U.S. PATENT DOCUMENTS 5,427,983 A * 6/1995 Ahmad et al. ............... 427/96.8
6,305,072 B1 10/2001 Yoda et al.
6,365,236 B1 * 4/2002 Maloney ........................ 427/585
6,752,952 B2 6/2004 Davis
6,931,700 B2 8/2005 Uchiyama
7,046,480 B2 5/2006 Sasaki et al.
7,248,436 B2 7/2007 Matono
2005/0268848 A1 * 12/2005 Wang ............................ 118/719
2007/0248753 A1 * 10/2007 Tyan et al. ................. 427/248.1

* cited by examiner

*Primary Examiner* — William Phillip Fletcher, III

(74) *Attorney, Agent, or Firm* — David D. Brush; Westman, Champlin & Koehler, P.A.

(57) ABSTRACT

A method of creating a stack having multiple layers of material deposited onto a substrate. The method includes controlling atom mobility to provide a uniform thickness for the deposited layers and increasing or decreasing a deposition temperature to control the atom mobility and/or roughness for the deposited layers. In an illustrated embodiment, the deposition temperature is increased to increase the atom mobility and the deposition temperature is decreased to decrease the atom mobility to control roughness and provide a uniform layer thickness. In another embodiment, the deposition temperature is increased or decreased for different portions of a layer. As described, a first amount of a material is deposited at a first deposition temperature to provide an optimum surface interface with a prior layer and a second amount of the material is deposited at a second deposition temperature to provide a uniform layer thickness.

12 Claims, 8 Drawing Sheets

CONTROLLING THICKNESS UNIFORMITY AND INTERFACES IN STACKS

BACKGROUND

Electrical devices such as integrated circuits, interface elements capable of reading and/or writing data from and to storage media, and other types of devices are often fabricated by applying layers of material onto a substrate. Thin layers of film material are applied to a wafer to create a large number of devices on the wafer, which are subsequently cut or milled into individual components. Such techniques advantageously enable the manufacture of increasingly miniaturized components.

SUMMARY

In one illustrative embodiment, a method of creating a stack having multiple layers of deposited film onto a substrate is discussed. The method includes depositing a first layer of a first material onto the substrate and depositing a second layer onto the first layer. Depositing the second layer onto the first layer includes depositing a first amount of a second material onto the first layer at a first deposition temperature selected to set the normalized diffusion activation energy of the first and second materials.

These and other features and benefits that characterize one or more embodiments of the present discussion will be apparent upon reading the following detailed description and review of the associated drawings.

DETAILED DESCRIPTION

Embodiments of the present discussion provided below refer to elements fabricated from layers of thin film material applied to a substrate. One type of element discussed below that advantageously employs elements fabricated from layers of thin film material includes transducers of a read and/or write head that interact with a data storage device. One skilled in the art recognize that the embodiments may also be applied to other types of elements, including, for example, integrated circuits.

Figure 1:
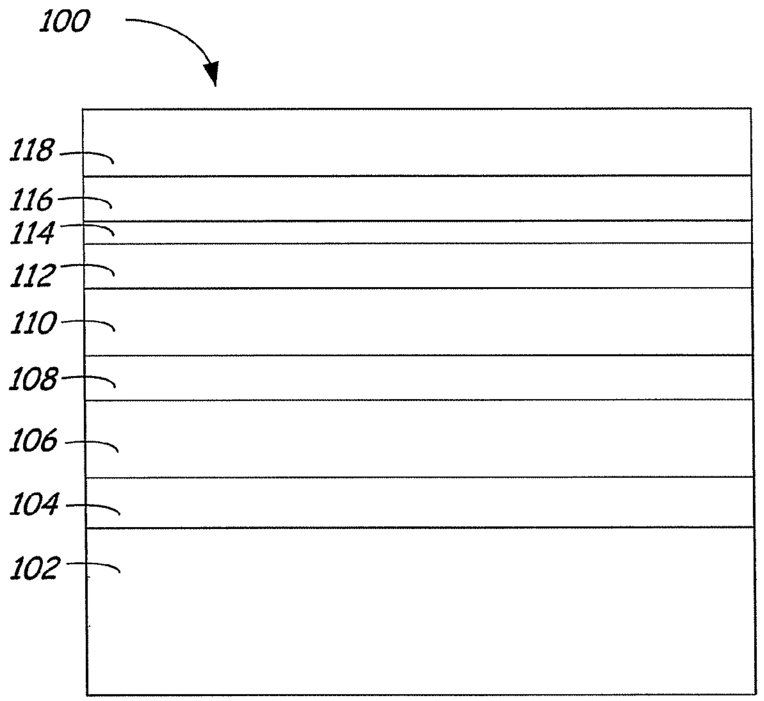
FIG. 1 is a schematic diagram of a substrate with a plurality of layers of thin film material applied to it, in accordance with embodiments of the disclosure.

FIG. 1 is a schematic diagram of a wafer 100 upon which the layers of thin film material are applied as part of a fabrication process to create a plurality of elements for use in a particular application. One example of such an element is an interactive element capable of reading and/or writing information from and/or to a data storage media. Other examples may include integrated circuits or other devices that are manufactured out of a plurality of thin film layers. The wafer 100 illustrated in FIG. 1 includes a substrate 102 upon which a series of layers 104, 106, 108, 110, 112, and 114 are illustratively applied. The layers 104-114 are shown having different thicknesses, as in various applications, different layer thicknesses may be advantageous. However, it should be appreciated that FIG. 1 is provided for discussion purposes only and is not intended to be drawn to any scale. For the purposes of this discussion, the wafer 100 is intended to depict the fabrication of interactive elements for reading and/or writing information from and/or to a data storage media. Such elements illustratively include a seed layer, shown as layer 104, a pinned layer 106, a metal spacer 108, a reference layer 110, a barrier layer 116, and a free layer 118. After the layers of material 104-114 are deposited or otherwise applied to the substrate 102, a process is performed to cut a plurality of interactive elements out of the wafer 100.

Figure 2:
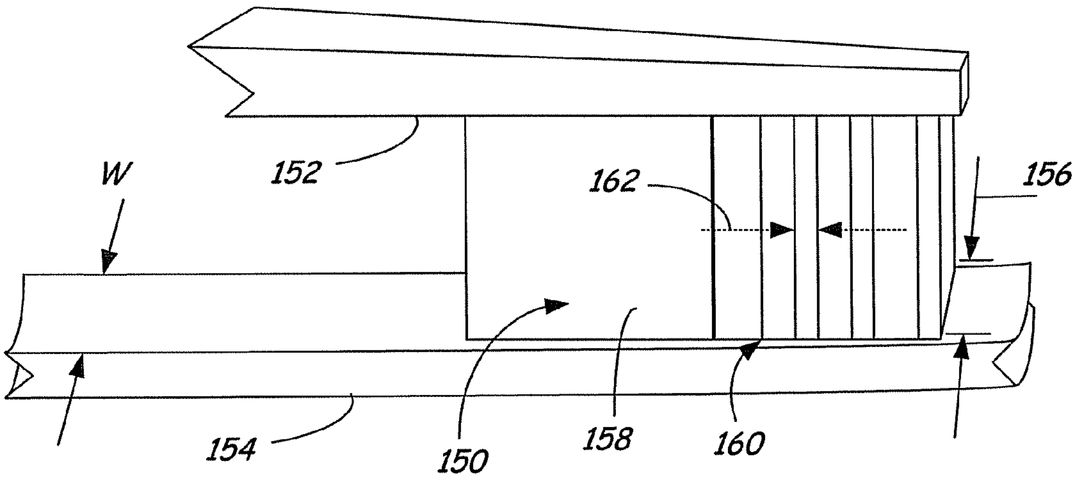
FIG. 2 is a schematic diagram of an interactive element having a stack of thin film materials of a type that can be used in close proximity with a storage device or other devices according to one embodiment of the present disclosure.

FIG. 2 illustrates an interactive element 150 including a plurality of layers of film material positioned adjacent a portion of a storage medium 154. The interactive element 150 is attached to an actuator arm 152. The interactive element 150 includes a substrate 158 upon which a plurality of layers 160 similar to the layers illustrated in FIG. 1 have been applied. Each of the layers has a thickness, such as the thickness 162 for one of the layers illustrated in FIG. 2. The interactive element 150, actuator arm 152 and storage medium 154 are shown for illustrative purposes only and it is not intended to be indicative of the actual geometry of any of these components. For example, the interactive element 150 is shown as having shape of a rectangular cube with a leading edge 164 that has a generally square surface with a width 156 that is uniform across the a top 166 to a bottom 168. In some embodiments, however, the interactive element 150 has other shapes. For example, the width of the of the interactive element in some embodiments can vary between the top and the bottom of the interactive elements. In some embodiments, the interactive element is narrower its bottom than at its top. For the purposes of this discussion, the width 156 of the interactive element 150 refers generally to the width of the interactive element proximal to the bottom 168 of the interactive element.

The portion of the storage medium 154 illustrated in FIG. 2 represents the width W of one track on a storage disk, for example. The interactive element 150 has a width 156 at the bottom 168 of the interactive element that is about the same as the width W of one track. As areal densities on storage media increase, the width of tracks on such devices decrease. Correspondingly, it is advantageous for the overall size of the interactive element 150 to decrease, including the width 156 of the interactive element 150 as well as the thickness of each of the layers. Uniform layer thickness, that is, uniformity of the thickness along the layer, has been identified as an important characteristic to maintain performance of the interactive element in some instances. Thus, it is often desirable to improve the uniformity of the thickness along a layer, especially as the layers of an interactive element become thinner overall. As the layers become thinner, even relatively minor, in absolute terms, variations of thickness across a layer can result in a large enough relative variation and a corresponding reduction in performance in some extremely thin layers. Therefore, when the thickness of the layers of the interactive element 150 is reduced to a mere few atoms, it becomes more challenging to maintain a generally uniform thickness for each of the layers especially when the surface upon which a layer is deposited is relatively rough.

In addition, as layers get thinner, the interface sharpness of the transition between layers can become increasingly important. Interface sharpness refers to the thickness of the interface between two layers as compared to the overall thickness of the two layers. The interface between two layers refers to a portion between two layers that includes material from each of the two layers. If the thickness of interface remains constant while the overall thickness of the layers decreases, the ratio of the interface thickness as compared to the overall thickness of the individual layers increases and the sharpness decreases. Decreased sharpness of layers can affect the electronic properties of some layers, thereby impacting the overall performance of the interface element. It is thus desirable, in many cases, to have stacks with layers having a high interface sharpness.

Figure 3:
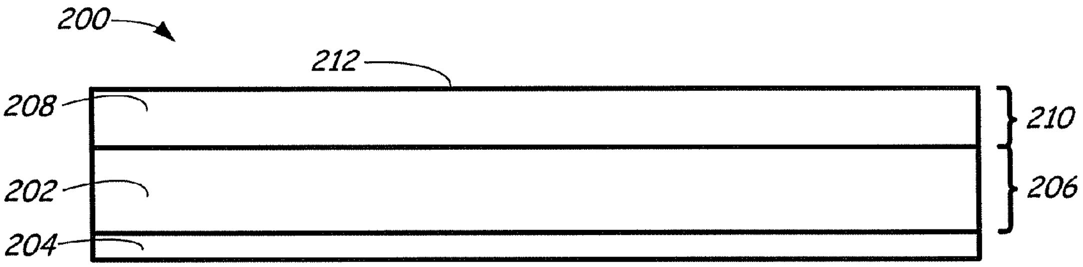
FIG. 3 is a schematic representation of an example of a portion of an exemplary interface element.

FIG. 3 is a schematic representation of an example of a portion of an interface element 200 showing a pair of layers. A first layer 202 is shown deposited on a substrate 204 having a uniform thickness 206. A second layer 208 is deposited onto the first surface 202. The second layer likewise is shown with a uniform thickness 210 and a smooth surface 212. As discussed above, both uniform thicknesses and a smooth surface are desirable characteristics for layers in the stack of an interface element. However, the examplary interface element 200 illustrated in FIG. 3 represents an ideal as related to uniform thickness and smoothness of surface. It is often the case that a substrate material or a previously applied layer does not have a smooth surface, that is, the previously applied layer has a non-zero roughness, unlike the surfaces illustrated in FIG. 3. When the top surface of a stack is less than smooth, especially with increasingly thin layers, a newly applied layer can have at most one of the desired attributes of generally uniform thickness and a generally smooth surface, but not both. It has been found that as layers get progressively thinner, a layer of uniform thickness is preferable to one that has a smooth surface and a non-uniform thickness, when thickness uniformity is identified as an important characteristic.

Figure 4:
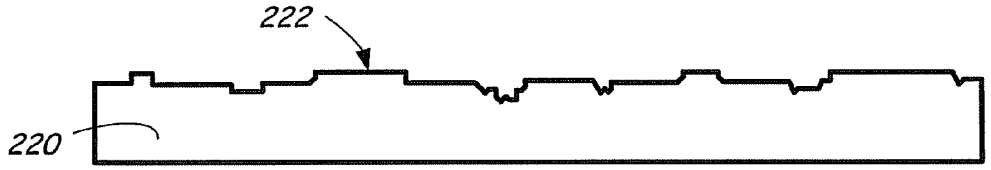
FIG. 4 is a schematic representation of a layer of material for an exemplary interface element having a non-zero roughness.

FIG. 4 provides an illustrative example of a material layer 220 with a top surface 222 that has a non-zero roughness. Material layer 220 is illustrative of a substrate material or the last layer previously applied onto a stack. It is to be understood that in many instances a layer or substrate such as material layer 220 may have a rough surface. As discussed above, having a uniform thickness across a layer is an advantageous characteristic. Thus, as layers get progressively thinner, a layer applied to the top surface 222 itself may have a rough top surface and be advantageously applied, that is, applied at a generally uniform thickness.

It has been found that controlling the temperature of a material when applying that material to form a layer onto a substrate or another layer can potentially advantageously influence both the uniformity of thickness of the material applied as well as the interface sharpness. More particularly, it has been found that depositing material within a desired temperature range controls the atom mobility of the material being applied to form a particular layer. Depositing a material within a temperature range that induces a desirable atom mobility encourages the material to be deposited in a layer of generally uniform thickness. More particularly, depositing a material within a temperature range that induces an atom mobility that is about the same as the previous layer causes a desired amount of material diffusion during the deposition process, which provides improved layer thickness uniformity. For example, it may be necessary to lower the deposition temperature of a material to reduce the mobility of its atoms.

Figure 5:
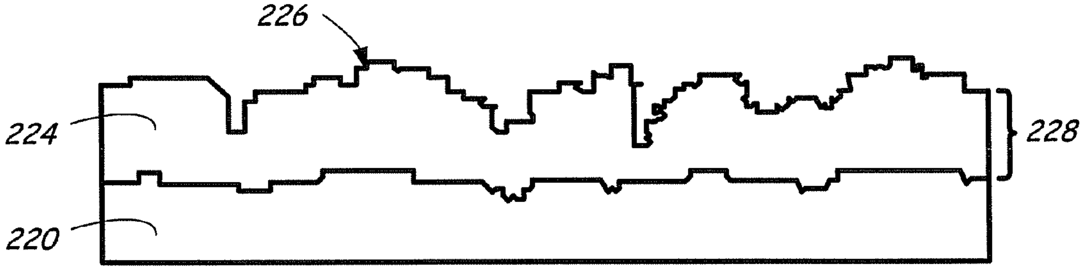
FIG. 5 is a schematic representation of one alternative of a layer of material applied to the layer of FIG. 4.
Figure 6:
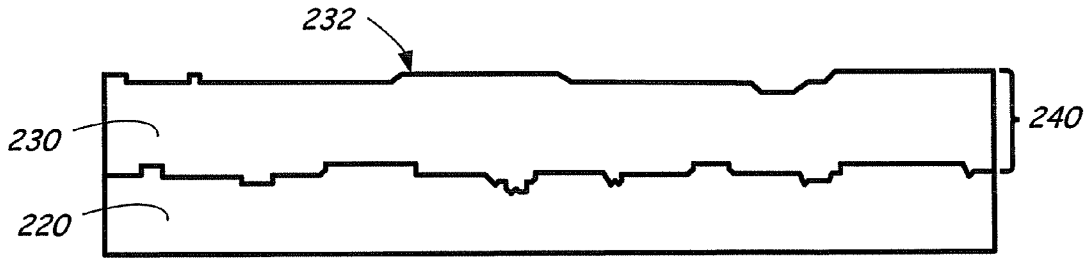
FIG. 6 is a schematic representation of another alternative of a layer of material applied to the layer of FIG. 4.
Figure 7:
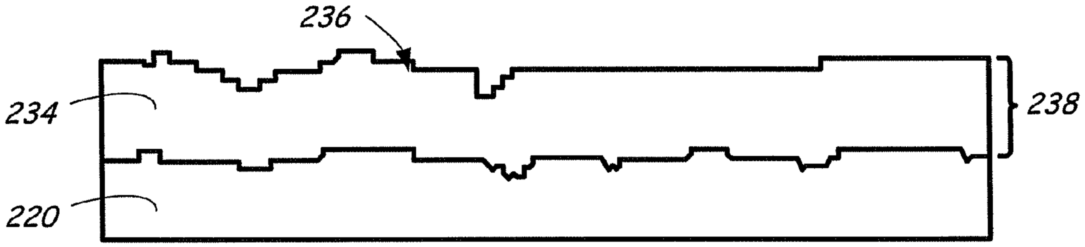
FIG. 7 is a schematic representation of still another alternative of a layer of material applied to the layer of FIG. 4.

FIGS. 5, 6, and 7 illustrate models of three layers of a material applied to the top surface 222 of material layer 220 at three different temperatures, inducing various levels of atom mobility. In one example, the material layer 220 has a diffusion activation energy, E, such that the ratio E/kT=18, where k is Boltzman's constant and T is the temperature of the material. In FIG. 5, a model layer 224 is shown applied to the material layer 220. Layer 224 is modeled to be applied at temperature $T_1$, which is selected so that the ratio E/kT=22. When applied at $T_1$, the material that constitutes layer 224 exhibits a generally rough top surface 226. Not only is the top surface 226 generally rough, but the layer 224 has a thickness 228 that is not particularly uniform. Layer 224, then, has been applied at a temperature, $T_1$, that induces a rough top surface 226, and does not induce a generally uniform thickness. This is because the atom mobility is not high enough to encourage enough diffusion of the applied material. Adjusting the deposition temperature—in this case, to a higher deposition temperature—will illustratively reduce the roughness of the surface layer and improve the uniformity of the layer thickness, as will be seen in the examples discussed below.

In FIG. 6, model layer 230 is shown as applied to the material layer 220. Layer 230 is modeled to be applied at a temperature, $T_2$, that is selected so that the ratio E/kT=15. Thus, temperature $T_2$ is higher than the temperature $T_1$ at which layer 226 was modeled. Model layer 230, as shown in FIG. 6, has a smoother top surface 232 than the top surface 226 of model layer 224. In FIG. 7, model layer 234 is intended to be applied to the material layer 220 at a temperature, $T_3$, that is greater than the temperature $T_1$ at which layer 226 was modeled, but less than the temperature $T_2$ at which layer 230 was modeled. Temperature $T_3$ is illustratively selected so that the ratio E/kT=18. A top surface 236 of model layer 234 is demonstrably smoother than the top surface 226 of model layer 224, but not as smooth as the top surface 232 of model layer 230. However, modeled results indicate that the layer 234 has a thickness 238 that is more uniform than a thickness 240 of layer 230. Temperture $T_3$ thus provides the best layer thickness uniformity. It should be appreciated that while in this instance, the selection of a preferred deposition temperature results in a ratio E/kT=18, the preferred deposition temperature and resulting ratio is dependent upon the diffusion activation energy of the layer or substrate upon which a particular material is deposited. In other words, applying a layer of material onto a base layer having a different diffusion activation energy or a different temperature than that of material layer 220 would mean, for example, that the temperature at which the layer to be applied preferrably would be selected to match a different ratio of E/kT.

Figure 8A:
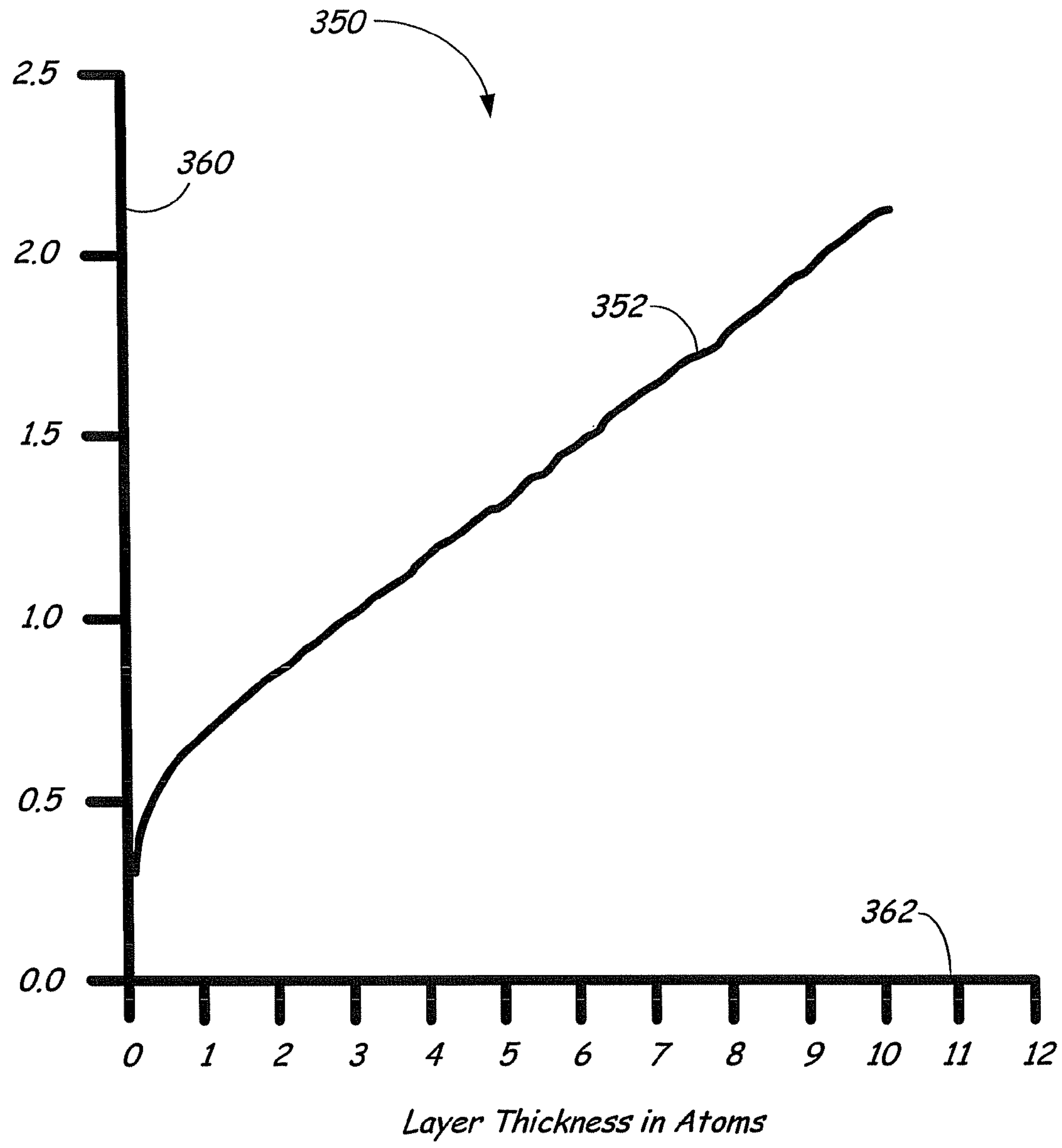
FIGS. 8A-8D are charts illustrating relative variation of the thickness of layers applied to a base layer, given an average thickness of the layers applied at differing energy to temperature ratios onto the base layer.
Figure 8B:
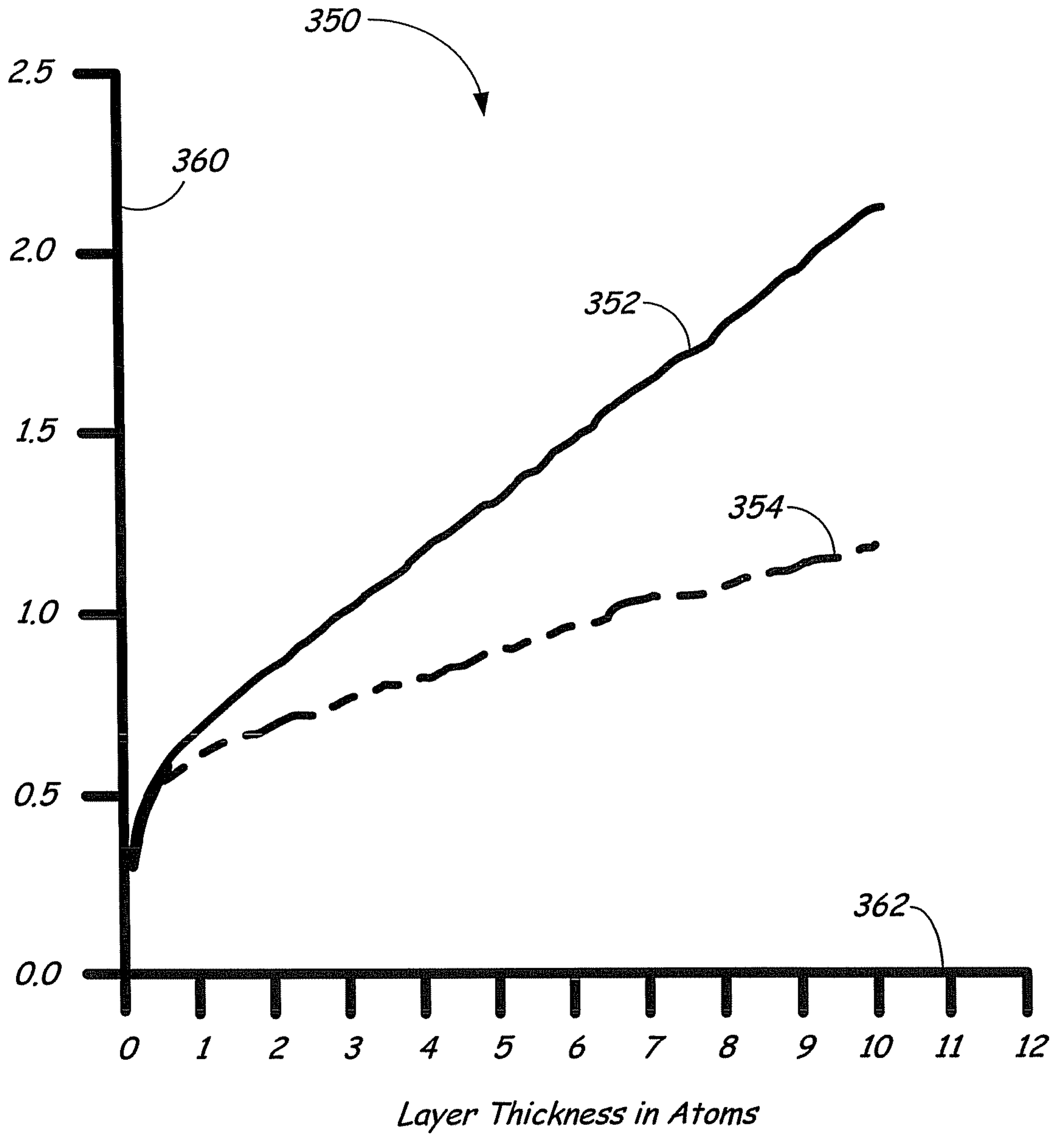
Figure 8C:
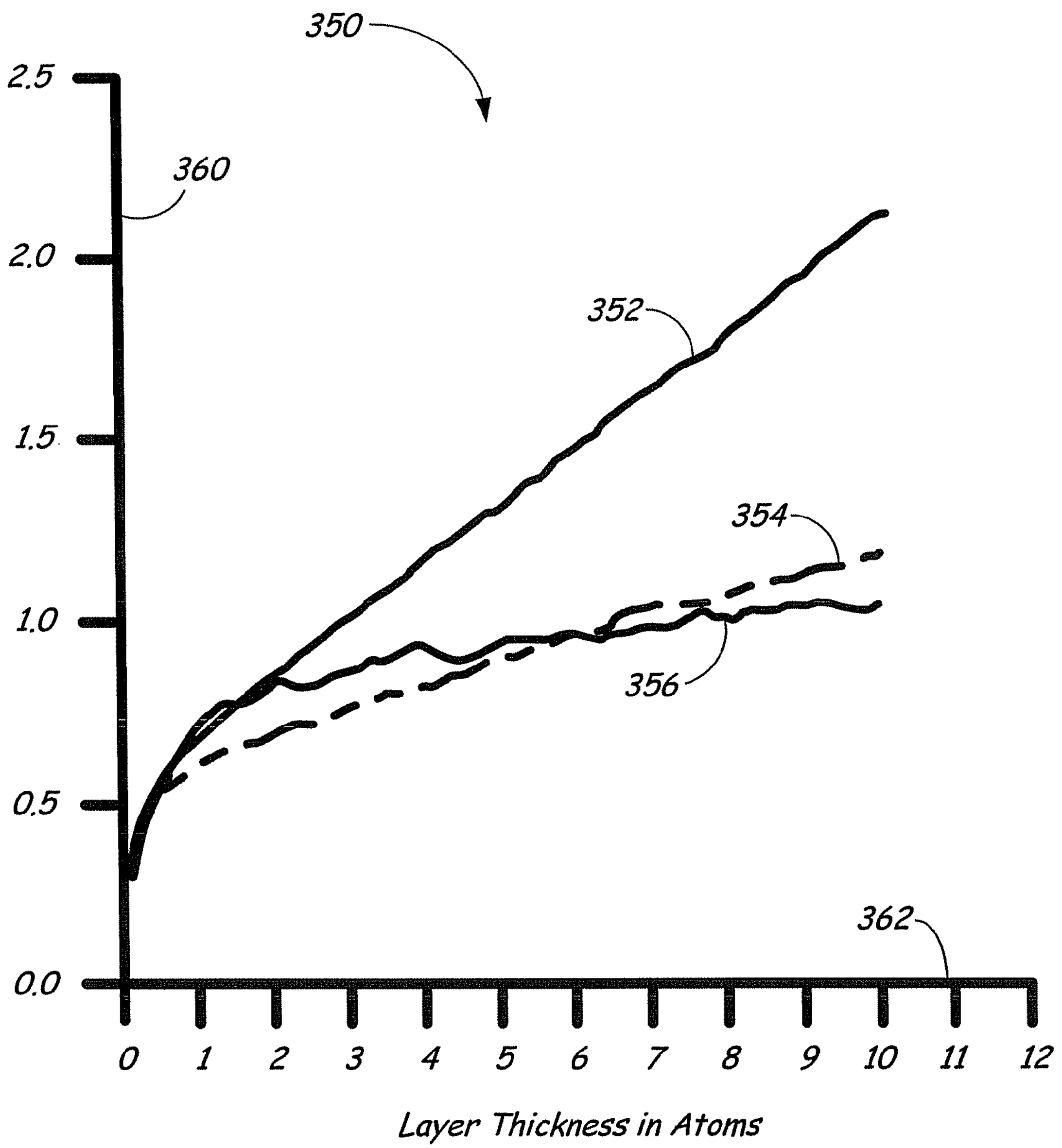
Figure 8D:
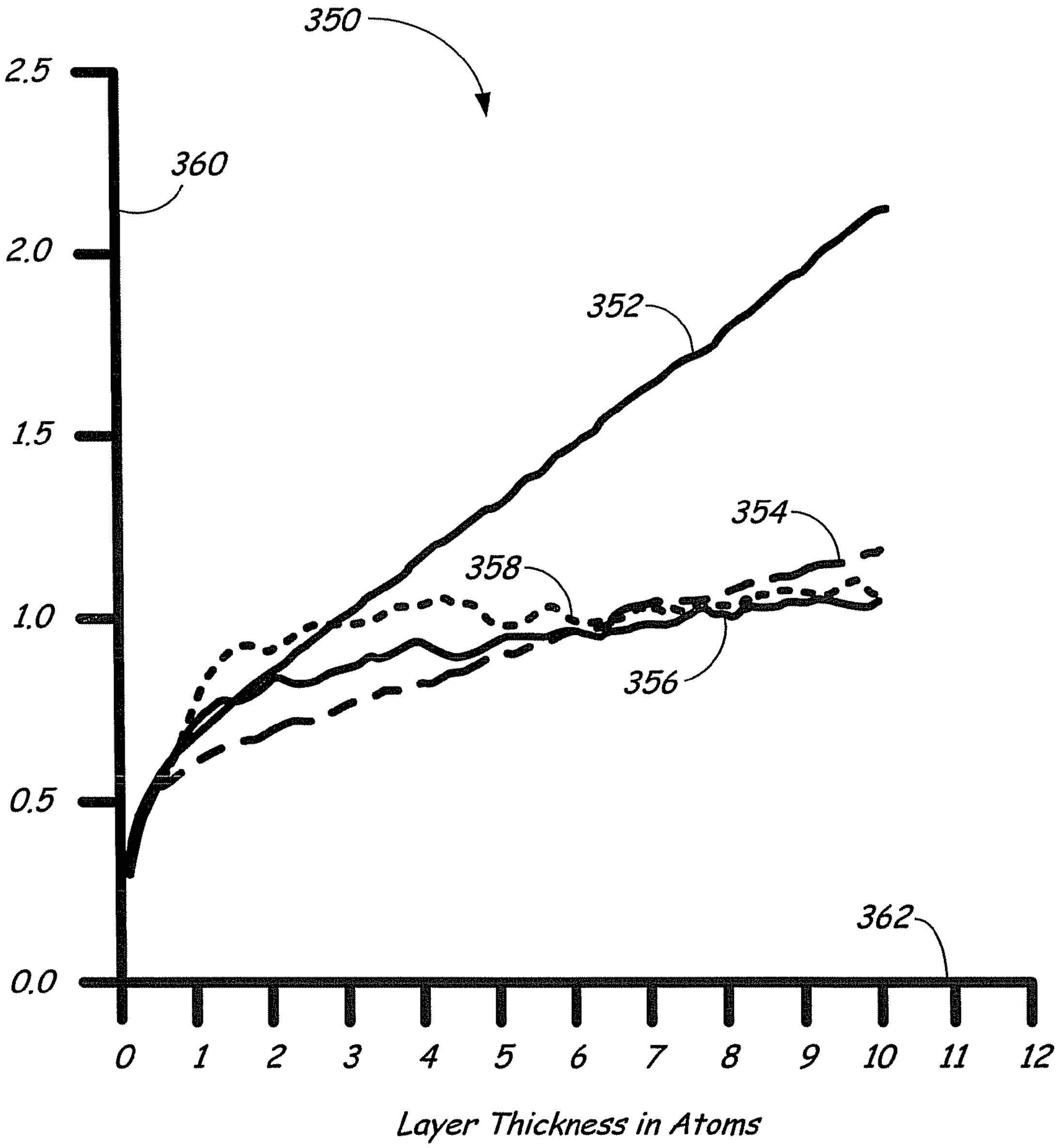

FIGS. 8A-8D show a chart 350 illustrating the relative variation of the thickness of layers, given an average thickness of the layers applied at differing energy-to-temperature ratios onto a base layer having a ratio of E/kT=18. Chart 350 plots the standard deviation of the thickness of four example layers. In FIG. 8A, a plot 352 representative of the standard deviation of a first example layer with a ratio E/kT=22 is illustrated with an additional layer added to each of the FIGS.

8B-8D. FIG. 10B includes both the first plot 352 and a second plot 354 that illustrates the standard deviation of a second layer having a ratio E/kT=18. Similarly, FIG. 8C additively includes a third plot 356, illustrating the variation of a third layer having a ratio E/kT=16, and FIG. 8D additively includes fourth plot 358 illustrating the variation of a fourth layer having a ratio E/kT=15.

As the overall thickness of a layer increases, the standard deviation of the thickness increases. Up to about a thickness of seven atoms, the second layer 354, the layer with the ratio that matches the energy to temperature ratio of the base layer, has the lowest standard deviation of thickness of any of the four layers. Thus, for extremely thin layers, it is shown that applying the layer at a temperature so that the atom mobility matches that of the base layer provides a layer with more uniform thickness.

As discussed above, not only is it advantageous to apply layers to achieve an uniform thickness, it is also advantageous to maximize the interface sharpness between layers. Because materials that make up adjoining layers are often dissimilar, the surface energy of neighboring layers is usually different. Deposition of a film material having a surface energy higher than that of the material onto which it is applied can lead to significant roughening of the interface as atoms from the layer having the lower surface energy tend to float up into the material with the higher surface energy and the atoms from the material with the higher surface energy tend to dig down into the layer with the lower surface energy causing material from the layers to be intermixed. Thus, the sharpness between the layers is reduced.

Figure 9A:
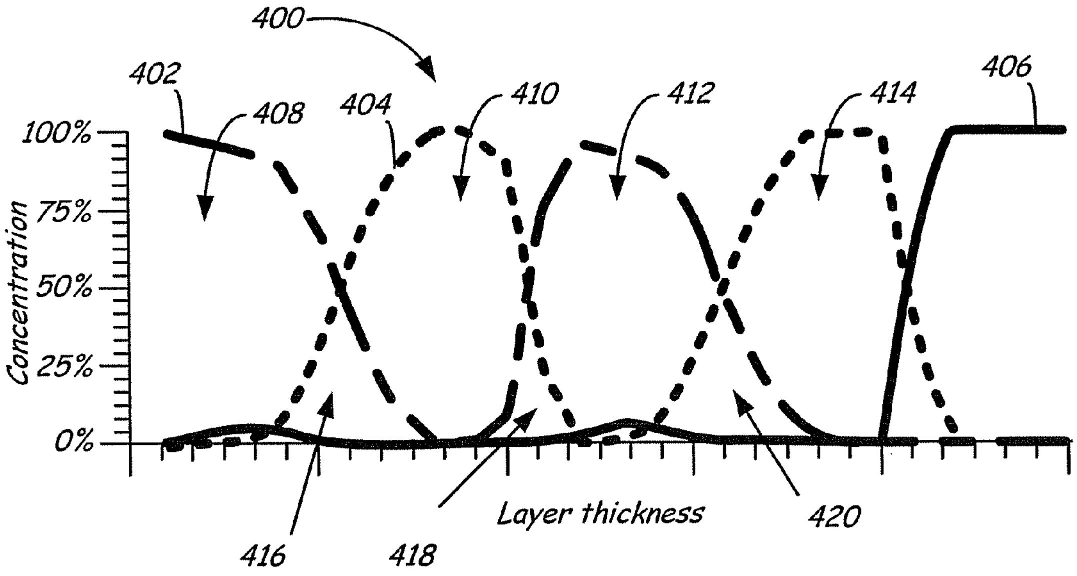
FIGS. 9A-9B are charts representing the concentration of two materials having differing surface energies applied in alternating layers onto a stack.
Figure 9B:
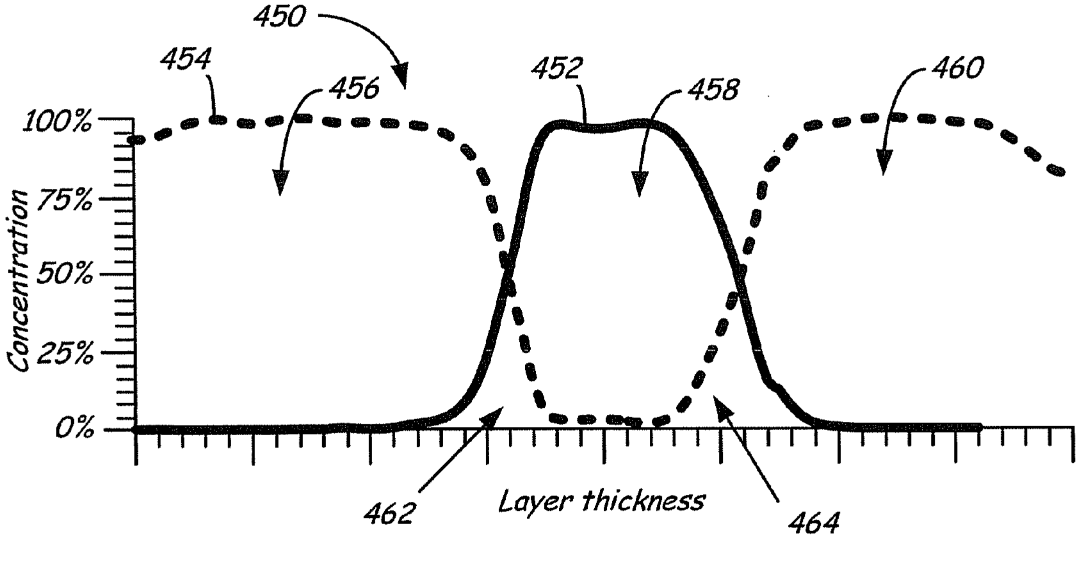

FIGS. 9A and 9B illustrate charts 400 and 450, respectively, which represent the concentration at a given thickness of a model stack with two materials having differing surface energies applied in alternating layers onto a stack. Chart 400 illustrates a model stack made of a first material, the concentration of which is represented by line 402 having a first surface energy and a second material, the concentration of which is represented by line 404 having a second surface energy that is higher than the first surface energy. In addition, the chart 400 illustrates vacancies 406 in the stack.

The chart 400 illustrates a model stack having four layers where one of the materials has a large concentration of material, separated by transitions, which illustrate rapidly changing concentrations of first and second materials. Reading the chart 400 from left to right, a first layer 408 is illustrated as being formed from the first material 402. A second layer 410 is formed from the second material 404, while third and fourth layers 412 and 414 are formed from the first material 402 and the second material 404, respectively. Between each of the layers are transitions 416, 418, and 420. Both of the transitions 416 and 420 from the first material 402 to the second material 404 appear to be thicker than the transition 418 from the second material 404 to the first material 402. This suggests what is discussed above, namely, that when a material having a higher surface energy is applied to one having a lower surface energy, the transition between the layers is roughened.

In FIG. 9B, the chart 450 illustrates the concentration of two materials in an actual stack. The concentrations of a first material 452 and a second material 454 are illustrated in three layers 456, 458, and 460. The first material 452 is Cu and the second material 454 is CoFe. A transition 462 from the first layer 456 to the second layer 458 is thicker than the transition 464 from the second layer 458 to the third layer 460. As can be seen, the first layer 456 and the third layer 460 are formed from the second material 454, which is CoFe, while the second layer 458 is formed from the first material 456. It is known that the surface energy of CoFe is higher than the surface energy of Cu, and thus, the second transition 464 is thicker, that is, rougher, than the first transition 462. As discussed above, lowering the deposition temperature for the layer being applied, the atom mobility of the material is reduced. Thus, in cases where a layer of film material with a higher surface energy is being deposited upon a layer with a lower surface energy, reducing the deposition temperature of the material to be applied will increase the interface sharpness between two layers as discussed above. In addition, for those cases where a layer of film material with a lower surface energy is being deposited upon a layer with a higher surface energy, raising the deposition temperature of the material to be applied may advantageously increase the interface sharpness between two layers.

Figure 10:
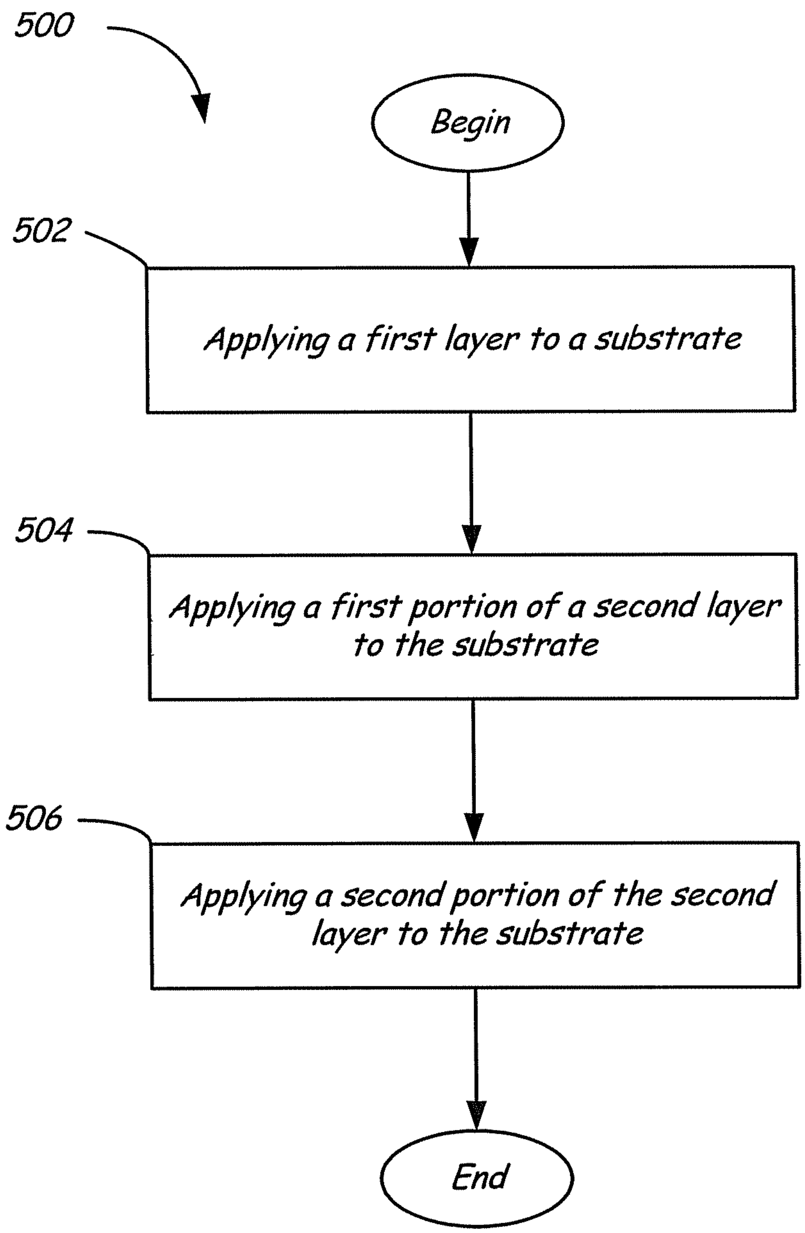
FIG. 10 is a flowchart illustrating a method of creating a stack for an interactive element according to one illustrative embodiment.

FIG. 10 illustrates a method 500 of applying of material on a stack according to one illustrative embodiment. At block 502, a first layer is applied onto a substrate. The first layer may be formed from any suitable material. For the purposes of this discussion, the substrate can be any material, including a previously applied layer. At block 504, a portion of the second layer is applied onto the first layer at a first deposition temperature. It should be appreciated that the second layer is formed from a different material than that of the first layer. As it is known what materials the first and second layers are formed from, the surface energies of the first and second layers are also known. The first deposition temperature is selected to apply a portion of the material of the second layer based on the surface energies of the first and second layers.

In one illustrative embodiment, the first deposition temperature is selected to reduce the amount of mixing that occurs between the first and second layers during the deposition of the second layer. As discussed above, this is accomplished by selecting the first deposition temperature to match the normalized diffusion activation energy of the material of the second layer to that of the first layer. Once enough of the material of the second layer has been deposed onto the first layer to cover the first layer, migration of material between the first and second layers is effectively halted so that the migration of material between the first and second layers is halted. It should be appreciated that the first deposition temperature may be selected so as to increase the sharpness of the transition between the first and second layers. The first deposition temperature may not be a temperature, however, that encourages uniformity of thickness of the layer.

After the material is disposed at the first temperature, an additional portion of the second layer is disposed at a second disposition temperature. This is illustrated in block 506. In one illustrative embodiment, the second deposition temperature is selected so that the ratio E/kT equals a specific value. As discussed above, in one embodiment, the second deposition temperature is advantageously selected to provide a similar atom mobility as the previous layer. It should be appreciated that the second deposition temperature can be higher, lower, or the same as the first deposition temperature. The deposition of material as described in block 506 is not concerned with establishing a temperature to prevent the mixing of material between the first and second layers. Instead, this step is primarily concerned with achieving a uniformity of thickness across a given layer. After the second layer has been applied to the first layer, successive layers can be applied to the stack in a similar manner. The selection of a second temperature, then, is made to urge material to be dispersed across the layer at a uniform thickness. Thus, the selection of first and second temperatures are made to improve different characteristics of the layers.

Returning to FIG. 9B as an example, first 462 and second 464 transitions are illustrated. The second transition 464 is the transition between the second layer 458, which is a layer of Cu to the third layer 460, which is a layer of CoFe. As mentioned above, the surface energy of CoFe is higher than the surface energy of Cu, and thus, the second transition 464 illustrated in FIG. 9B is thicker, that is, rougher, than the first transition 462. By applying the first portion of CoFe at a lowered temperature, the thickness of the second transition 464 can be reduced. Once the second layer 458 is covered by CoFe, the deposition temperature of the CoFe can then be adjusted to create a layer with an improved uniformity of thickness. By depositing portions of the CoFe material at different temperatures, both improving sharpness and uniformity of layer thickness can be accomplished.

It is to be understood that even though numerous characteristics and advantages of the various embodiments have been set forth in the foregoing description, together with details of the structure and function of various embodiments, this disclosure is illustrative only, and changes may be made in detail, especially in matters of structure and arrangement of parts within the principles of the present embodiments to the full extent indicated by the broad general meaning of the terms in which the appended claims are expressed.

What is claimed is:

1. A method, comprising:

depositing a first layer of a first material onto a substrate at a deposition temperature for the first layer;

decreasing the deposition temperature to deposit a second layer of a second material to reduce an atom mobility of the second layer if an atom mobility of the first layer is lower than the atom mobility of the second layer at the deposition temperature for the first layer;

increasing the deposition temperature for the second layer to increase the atom mobility of the second layer if the atom mobility of the first layer is higher than the atom mobility of the second layer at the deposition temperature for the first layer; and depositing the second layer of the second material onto the first layer at the increased or decreased deposition temperature.

2. The method of claim 1, wherein the step of depositing the second layer onto the first layer comprises:

depositing a first amount of the second material of the second layer at a first deposition temperature; and depositing a second amount of the second material of the second layer onto the first amount at a second deposition temperature different from the first deposition temperature.

3. The method of claim 1, wherein the steps of increasing or decreasing the deposition temperature comprises increasing the deposition temperature to increase the atom mobility of the second layer so that the atom mobility of the second layer is about the same as the first layer.

4. The method of claim 1, wherein the steps of increasing or decreasing the deposition temperature comprises decreasing the deposition temperature to reduce the atom mobility of the second layer so that the atom mobility of the second layer is about the same as the first layer.

5. A method comprising:

depositing a first layer of a first material at a deposition temperature for the first layer;

increasing the deposition temperature for a first amount of a second material of a second layer if a surface energy of the second material is lower than a surface energy of the first layer;

decreasing the deposition temperature for the first amount of the second material of the second layer if the surface energy of the second material is higher than the surface energy of the first layer;

depositing the first amount of the second material at the increased or decreased deposition temperature;

increasing or decreasing the deposition temperature prior to depositing a second amount of the second material; and depositing the second amount of the second material on top of the first amount of the second material at the increased or decreased deposition temperature.

6. The method of claim 5 wherein the first material has a first diffusion activation energy and the second material has a second diffusion activation energy different from the first material comprising:

increasing the deposition temperature for the second amount of the second material if the diffusion activation energy of the second material is larger than the diffusion activation energy of the first material or decreasing the deposition temperature of the second amount of the second material if the diffusion activation energy of the second material is smaller than the diffusion activation energy of the first material.

7. The method of claim 5 wherein the first material has a first diffusion activation energy E and the deposition of the first material provides a ratio of E/kT which varies with temperature, where E is the diffusion activation energy, k is a constant and T is the deposition temperature and the second material has a second diffusion activation energy E different from the first activation energy and comprising:

increasing or decreasing the deposition temperature prior to depositing the second amount of the second material to match a ratio of E/kT for the second material with the ratio of E/kT for the first material.

8. The method of claim 5 wherein the step of increasing or decreasing the deposition temperature prior to depositing the second amount of the second layer comprises:

increasing or decreasing the deposition temperature to match an atom mobility of the second layer with an atom mobility of the first layer.

9. A method comprising:

depositing a first layer of a first material onto a substrate at a deposition temperature for the first material;

increasing or decreasing the deposition temperature for a second material so that a ratio of E/kT where E is a diffusion activation energy, k is a constant and T is the deposition temperature of the first material is about the same as the ratio of E/kT for the increased or decreased deposition temperature of the second material; and depositing a second layer of the second material onto the first layer of the first material at the increased or decreased deposition temperature for the second material.

10. The method of claim 9 wherein the step increasing or decreasing the deposition temperature of the second material comprises:

increasing the deposition temperature of the second material.

11. The method of claim 9 wherein the steps of increasing or decreasing the deposition temperature of the second material comprises:

decreasing the deposition temperature of the second material.

12. The method of claim 9 comprising depositing a first amount of the second material at a first deposition temperature; and depositing a second amount of the second material onto the first amount at a second deposition temperature different from the first deposition temperature.

* * * * *